US012704545B2

(12) United States Patent
Ascazubi et al.

(10) Patent No.: US 12,704,545 B2

(45) Date of Patent: Aug. 11, 2026

(54) LASER-INDUCED HOT CARRIER INJECTION (HCI) FOR ACCELERATED AGING OF INTEGRATED CIRCUITS

(71) Applicant: Intel Corporation, Santa Clara, CA (US)

(72) Inventors: Ricardo Ascazubi, Hillsboro, OR (US); Georgia Modoran, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 17/684,330

(22) Filed: Mar. 1, 2022

(65) Prior Publication Data

US 2022/0187362 A1 Jun. 16, 2022

Related U.S. Application Data

(60) Provisional application No. 63/307,335, filed on Feb. 7, 2022.

(51) Int. Cl.
*G01R 31/28* (2006.01)

(52) U.S. Cl.
CPC ................................ *G01R 31/2875* (2013.01)

(58) Field of Classification Search
CPC ................ G01R 31/28; G01R 31/2621; G01R 31/2642; G01R 31/2656; G01R 31/275; G01R 31/2875; G01R 31/311
See application file for complete search history.

(56) References Cited

U.S. PATENT DOCUMENTS

| | | | | |
|---|---|---|---|---|
| 6,549,022 B1 | 4/2003 | Cole, Jr. et al. | | |
| 7,019,311 B1 * | 3/2006 | Horn | G01R 31/2881 | 250/214 R |
| 2006/0066325 A1 * | 3/2006 | McGinnis | G01R 31/311 | 324/754.23 |
| 2006/0208753 A1 * | 9/2006 | Tosi | G01R 31/311 | 324/756.07 |
| 2012/0056626 A1 * | 3/2012 | Vedagarbha | G01R 31/303 | 324/501 |

(Continued)

FOREIGN PATENT DOCUMENTS

JP H0766115 A * 3/1995 ........... H01L 21/027

OTHER PUBLICATIONS

Horn et al. "Laser measurement techniques for detecting age related degradation of device radiation response", IEEE Xplore, Jul. 2009 (Year: 209).*

(Continued)

*Primary Examiner* — Eman A Alkafawi
*Assistant Examiner* — Courtney G Mcdonnough
(74) *Attorney, Agent, or Firm* — Essential Patents Group, LLP

(57) ABSTRACT

Laser-assisted integrated circuit (IC) device testing apparatus capable of inducing hot carrier injection (HCI) within selected transistors of an IC device. A laser source of sufficiently high output power (e.g., 1 W) and short pulse duration (e.g., 100 fs) can generate enough hot carriers through a multi-photon (e.g., TPA) carrier injection mechanism to significantly accelerate HCI aging even at low transistor voltage bias (e.g., <1.5V). Rapid laser-assisted HCI transistor aging can selectively degrade transistors of individual functional IC blocks within an IC device.

20 Claims, 10 Drawing Sheets

(56) References Cited

U.S. PATENT DOCUMENTS

| | | | |
|---|---|---|---|
| 2014/0375794 | A1 | 12/2014 | Singh |
| 2016/0049381 | A1 | 2/2016 | Ryu et al. |
| 2021/0370439 | A1 | 12/2021 | Myung et al. |
| 2022/0221510 | A1 | 7/2022 | Ascazubi et al. |

OTHER PUBLICATIONS

English translation JP H0766115 A (Year: 1995).*
Serrels, Keith A. et al., "Two-photon laser-assisted device alteration in silicon integrated-circuits," Optics Express, Dec. 2, 2013, vol. 21, No. 24, pp. 29083-29089.

* cited by examiner

LASER-INDUCED HOT CARRIER INJECTION (HCI) FOR ACCELERATED AGING OF INTEGRATED CIRCUITS

CLAIM OF PRIORITY

This application claims the benefit of priority to U.S. Provisional Patent Application No. 63/307,335, filed Feb. 7, 2022 and titled "LASER-INDUCED HOT CARRIER INJECTION (HCI) FOR ACCELERATED AGING OF INTEGRATED CIRCUITS," which is incorporated by reference in its entirety for all purposes.

BACKGROUND

In the manufacture of integrated circuit (IC) devices, Hot Carrier Injection (HCI) damage is an important aging process to understand. Hot carrier injection (HCI) is a phenomenon in solid-state electronic devices where a charge carrier (e.g., electron or hole) gains kinetic energy with the term "hot" referring to the effective temperature used to model carrier density (e.g., with a Fermi-Dirac function). Consequences of HCI include increased transistor leakage current and permanent physical damage to the gate insulator and/or channel interface or drain material if the hot carrier disrupts atomic structure. When interface states are created, the threshold voltage is modified and subthreshold slope is degraded. This leads to lower on-state current and degrades the operating frequency of integrated circuit. Accordingly, HCI is one of the mechanisms that adversely affects the reliability of semiconductors of solid-state devices Internal electric field strength increases in aggressively scaled MOSFETs, which increases switching speed, but also presents a major reliability problem for the long term operation of these devices because the high fields induce more HCI during normal operation over the lifetime of the IC device. The accumulation of damage in device behavior attributable to hot carrier injection is called "hot carrier degradation." The useful lifetime of an IC device is thus affected by the lifetime of the MOS transistor itself. To assure an IC device will not have its useful life impaired by HCI, HCI degradation must be well understood.

Transistor damage associated with hot carrier injection occurs in various operating conditions of a transistor, but the primary mode of concern is during switching in a digital circuit. Most of the HCI damage is thought to occur when the transistor transitions from the OFF state, at which point there exists a large lateral field from source to drain, to the ON state when current flows. Initial charge carriers during the transition are accelerated by the peak electrical field and enter the drain with particularly high energies.

However, the switching action is very difficult to reproduce in DC testing conditions because in real use, transistor power dissipation is low both before and after the switching transition. In the characterization of hot carrier degradation, the carrier acceleration technique conventionally practiced is therefore limited to applying an increased voltage and current. However, testing a device structure under such I-V induced stress introduces problems that are atypical with normal operation, such as DC current self-heating creating unrealistic high temperatures within the transistor structure.

Also, for product characterization where a packaged IC is operated with an applications board to simulate a specific customer application, it may not be possible to raise supply rail voltages sufficiently to meaningfully accelerate HCI degradation. For example, the platform power delivery system or the thermal power envelope of an applications board may prohibit significantly larger supply voltages. Furthermore, extended operation outside of intended use conditions can induce other effects (e.g., power supply or thermal diode malfunction), which can become the main reliability limiter before meaningful HCI aging data can be collected.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
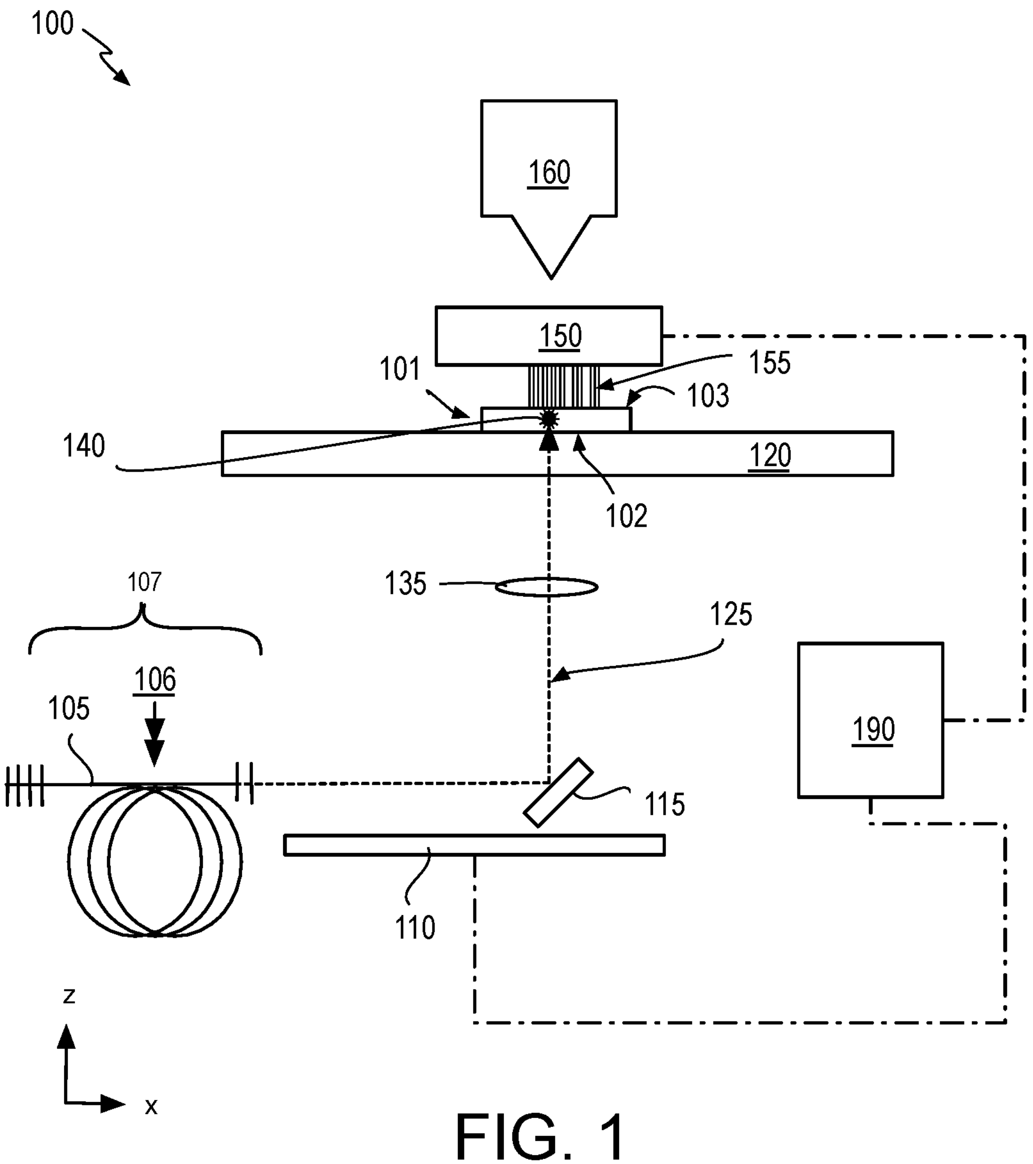
FIG. 1 is a schematic of a laser-based system suitable for accelerating damage through hot carrier injection, in accordance with some microprobe embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

In accordance with embodiments herein, accelerated hot carrier aging is induced with a high-power ultrafast laser. An electric field is generated within one or more transistors of a target portion of an IC device and a laser source of sufficiently high output power (e.g., 1 W) and short pulse duration (e.g., 100 fs) is directed at the transistors to generate a large population of hot carriers within the electric field through a multi-photon (e.g., TPA) carrier injection mechanism. The inventors have found the multi-photon-induced hot carrier population to significantly accelerate HCI aging even at low transistor voltage bias (e.g., <1.5V), avoiding the problems associated with electrical stress based on overvoltages. The high spatial resolution of laser-based hot carrier aging enables selected functional IC blocks within an IC device to be rapidly aged, for example with hours or days of lab stress being equivalent of several years of normal device use.

Embodiments herein may be referred to as Laser-Assisted Device Degradation (LADD), which is to be distinguished from conventional Laser-Assisted Device Alteration (LADA). Whereas the ultimate goal of LADA is to identify the location of faulty, marginal, or sensitive transistors within an IC device, the ultimate goal of LADD embodiments described herein is instead to accelerate the aging of targeted transistors.

Accordingly, LADA techniques induce operationally sensitive transistors to advance or retard their switching characteristics in order to alter the pass/fail outcome of some predetermined marginal test stimulus exercising the IC device and thereby localize areas of an IC device whose designs limit its overall speed, or other performance parameter. Such laser stimulation therefore induces temporary probing effects. In contrast, the Laser-Assisted Device Degradation systems and techniques described herein induce damage within any targeted transistor(s) of an IC device. In exemplary embodiments, the transistor-level damaged induced is from hot carrier injection (HCI), which permanently alters the targeted transistors through a mechanism known to occur during normal operation, albeit at a much lower rate in the absence of laser stimulation.

As described further below, light-matter interactions are leveraged through multi-photon carrier injection mechanisms to generate large populations of charge carriers having sufficiently high kinetic energy (i.e., hot) within transistor regions where an electric field induces hot carrier damage. Accordingly, average power of the laser source in LADD embodiments herein is significantly greater than that of LADA systems (e.g., 10-20×). Also, whereas an ultrafast pulsed laser may be enlisted in LADA to time resolve single-event effects by synchronizing an incident laser pulse in time with a transistor's switching event, an ultrafast pulsed laser may be advantageously enlisted in LADD embodiments herein to achieve extremely high photon densities that result from very high peak power. These high photon densities ensure a high energy-density of injected multi-photon-generated carriers.

As also described further below, while LADA stimulation may be of extremely short duration (e.g., on the order of milliseconds to trigger a soft error through a single upset event), LADD embodiments described herein extend the duration of laser stimulation to minutes, hours, or days as a substantial acceleration of aging phenomena that would otherwise require years to accumulate in absence of laser stimulation.

Figure 2:
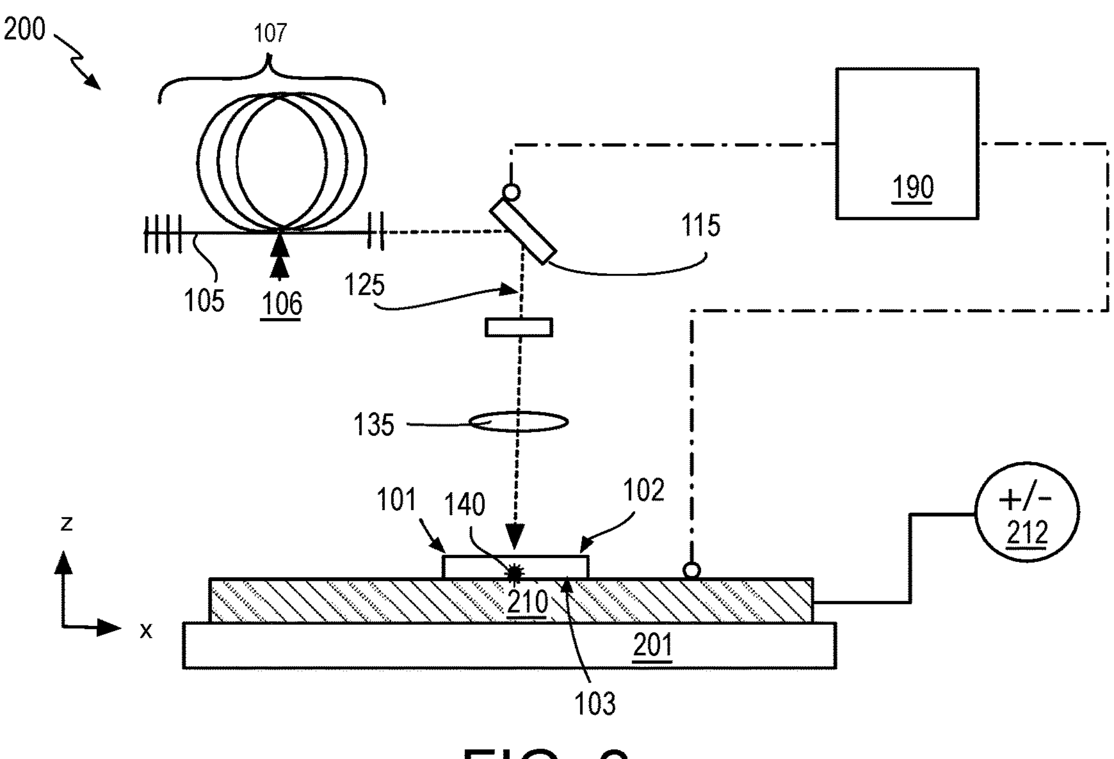
FIG. 2 is a schematic of a laser-based system suitable for accelerating damage through hot carrier injection, in accordance with some alternative embodiments.
Figure 3:
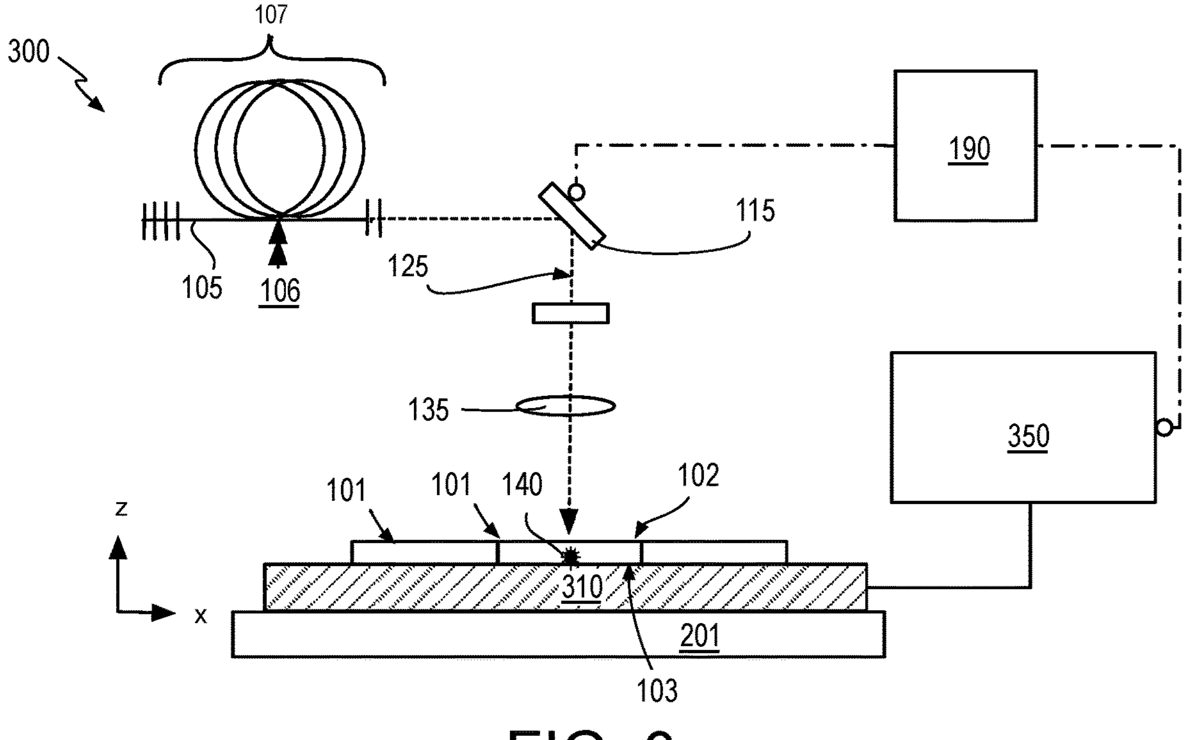
FIG. 3 is a schematic of a laser-based system suitable for accelerating damage through hot carrier injection, in accordance with some alternative embodiments.

FIG. 1, FIG. 2 and FIG. 3 illustrate laser-based systems 100, 200 and 300, in accordance with some exemplary embodiments. Each of the laser-based systems 100, 200 and 300 are suitable for practicing methods of accelerating the accumulation of transistor damage resulting from hot carrier injection, referred to herein as accelerated HCI aging. Each of the exemplary systems 100, 200 and 300 include an electrical test interface operable to exercise one or more transistors of an IC device under test (DUT) 101. In accordance with some advantageous embodiments, the electrical test interface is also operable to measure one or more electrical performance parameters associated with targeted transistors of IC DUT 101, either during or subsequent to, the practice of a laser-based HCI aging process.

In system 100, the electrical test interface includes a microprobe card 150, which further comprises a plurality of microprobes 155 that make electrical contact with any number of testable points (e.g. on a top-level metallization) on a front-side surface 103 of IC DUT 101. In some examples where IC DUT 101 is microprocessor die, front-side die surface 103 may have thousands of testable points having a pitch of 100 μm, or less, which microprobes 155 may contact. For the embodiments illustrated in FIG. 1, IC DUT 101 is an unpackaged die, or chip with a back-side 102 supported by a stage material 120. One or more of stage material 120 and probe card 150 may be displaceable relative to the other. Each of microprobes 155 is an electrically conductive probe pin that extends outwardly from an anchor point on microprobe card 150. Microprobes 155 may be laterally aligned with, and vertically landed upon, test points on front-side surface 103 through the use of any suitable probing microscope 160. Microprobe card 150 electrically couples microprobes 155 to a programmable electrical-testing apparatus (not depicted), which may exercise IC DUT 101 as further described below.

In the exemplary system 200 (FIG. 2), the electrical test interface includes a host applications board 210. For the embodiments illustrated in FIG. 2, front-side die surface 103 is facing host board 210 with IC DUT 101 having been assembled upon board 210, for example according to any flip-chip assembly technique. In system 200, IC DUT 101 may be a fully packaged die that may be partially deprocessed to expose a bulk substrate on back-side surface 102. Host board 210 may be any board designed to interface with IC DUT 101 under normal operating conditions for any field application. In some examples where IC DUT 101 is a microprocessor including functional IC blocks that execute instructions, host board 210 is a motherboard, for example further comprising a chip set that stores and/or communicates instructions with IC DUT 101. Host board 210 is further coupled to a power supply 212 and is to power IC DUT 101 (e.g., through one or more pair of power rails) in any manner needed to exercise IC DUT 101.

In the exemplary system 300 shown in FIG. 3, the electrical test interface includes a tester interface board 310, which may include one or more sockets or other means of electrically interfacing automated test equipment (ATE) 350 with IC DUT 101. For the embodiments illustrated in FIG. 3, front-side IC surface 103 is facing tester interface board 210 with back-side die surface 102 exposed. In system 300, IC DUT 101 may be a singulated die, or chip, that has been at least partially packaged. Alternatively, IC DUT 101 may be in wafer/package panel form suitable for wafer-level/panel-level automated electrical testing.

Each of the electrical test interfaces of systems 100, 200 and 300 are operable to induce an electric field within one or more predetermined transistors that have been targeted for laser-assisted HCI aging. In exemplary embodiments, the electric field is induced through a biasing applied across two or more terminals of a field effect transistor (FET). The terminals may be any of a gate, source or drain. In some embodiments, an electrical field induced within a channel region of one or more FETs is the result of a voltage bias between source and drain terminals ($V_{ds}$) of the FET. Although electrical test interfaces of systems 100, 200 and 300 may exercise IC DUT 101 with $V_{ds}$ overvoltage (e.g., 1.5V, or more), in advantageous embodiments the electrical test interfaces are to expose target transistors within IC DUT 101 to a $V_{ds}$ that is within the normal use threshold rating of the IC device. For example, where IC DUT 101 is a logic or memory device with a normal use $V_{ds}$ rating of 1.2V, the electrical test interfaces of systems 100, 200 and 300 are to exercise target transistors of IC DUT 101 with a $V_{ds}$ of no more than 1.2V. Notably, in absence of any $V_{ds}$ overvoltage, problems like DC self heating within the targeted transistor can be avoided. Furthermore, for embodiments where the electric test interface comprises host applications board 210 (FIG. 2), power delivery and or thermal power envelop limitations associated applications board 210 pose no difficulty.

As illustrated in FIG. 1-3, systems 100, 200 and 300 further include a laser source 107 to output a photon beam 125. In exemplary embodiments laser source 107 is a high power, ultrafast laser with shorter pulse widths being advantageous for higher peak powers. Laser source 107 is advantageously a Class 4 laser, having an average output power of at least 0.5 W. In some exemplary embodiments, laser source 107 has an average output power rating of at least 1 W. Laser source 107 may have an output beam wavelength of 1200 nm- 1800 nm. The output wavelength has an energy that is advantageously less than that of the semiconductor bandgap of the channel material in the targeted transistors. In exemplary embodiments where the FET channel material is silicon, laser source 107 as a center output wavelength of 1550 nm. For such embodiments, the energy of one photon at 1550 nm is 0.8 eV, which is smaller than the silicon bandgap of ~1 eV. Silicon is therefore generally transparent at this wavelength. However, because laser source 107 is ultrafast, (e.g., having a pulse duration of less than 150 femtoseconds and advantageously no more than 100 femtoseconds with at least a 10 MHz repetition rate), delivers a pulse with a peak power on the order of 1 megawatt.

In the exemplary systems 100, 200 and 300, laser source 107 is illustrated as a fiber laser 105 with a pump laser 106 that may also be a fiber laser. While such fiber laser architectures are well-known for their high power levels, embodiments herein are not limited to a fiber laser architecture, and laser source 107 may have any architecture capable of achieving the above performance specifications.

As further illustrated in FIG. 1-3, systems 100, 200 and 300 each include a beam steerer, such as one suitable for laser scanning microscopes (LSM), to direct the laser beam output by laser source 107 so as to irradiate one or more target transistors of IC DUT 101. The LSM beam steerer comprises at least a galvanometer 115 and an objective lens 135 within the optical beam path. Galvanometer 115 may be any known to be suitable for a scanning microscope, comprising for example a motor, a mirror, and voltage-feedback based servo driver board that controls the system. In some exemplary embodiments, galvo 115 comprises an optical angle encoder that employs a graduated glass disk. The inventors have found such glass-disk galvos to provide significantly greater stability than voltage-feedback based servo drivers. As described further below, this greater stability is important for laser-based aging as the duration of irradiation can extend to several days.

Objective lens 135 is to focus the laser beam to a spot below the surface of IC DUT 101. For example, in system 100 (FIG. 1) objective lens 135 focuses laser beam 125 through back-side die surface 102 to a focused beam spot 140 having a diameter that is advantageously less than 2 μm, and more advantageously no more than 1 μm. System 100 is bottom-side illuminated with laser beam 125 passing through a stage material 120, such as sapphire, that is substantially transparent to laser beam 125. Systems 200 and 300 illustrate alternative top-side illumination. For top-side illumination, stage material 201 need not be transparent over the band of laser beam 125.

As further illustrated in FIG. 1-3, systems 100, 200 and 300 each include a controller 190. Controller 190 is to irradiate the targeted transistors with beam 125, for example controlling one or more of beam steering and position of stage material 120 or 201 relative to beam 125. In addition to targeting beam 125 to intersect particular regions of DUT 101 such that charge carriers originated by the beam will be accelerated by the electric field induced by the electrical testing interface, controller 190 is to further control a duration of the beam exposure. Controller 190 may, for example, maintain beam delivery and an electric field for a sufficient duration that charge carriers originated by the beam and accelerated by the electric field induce a measurable degradation in the targeted transistors.

Figure 4:
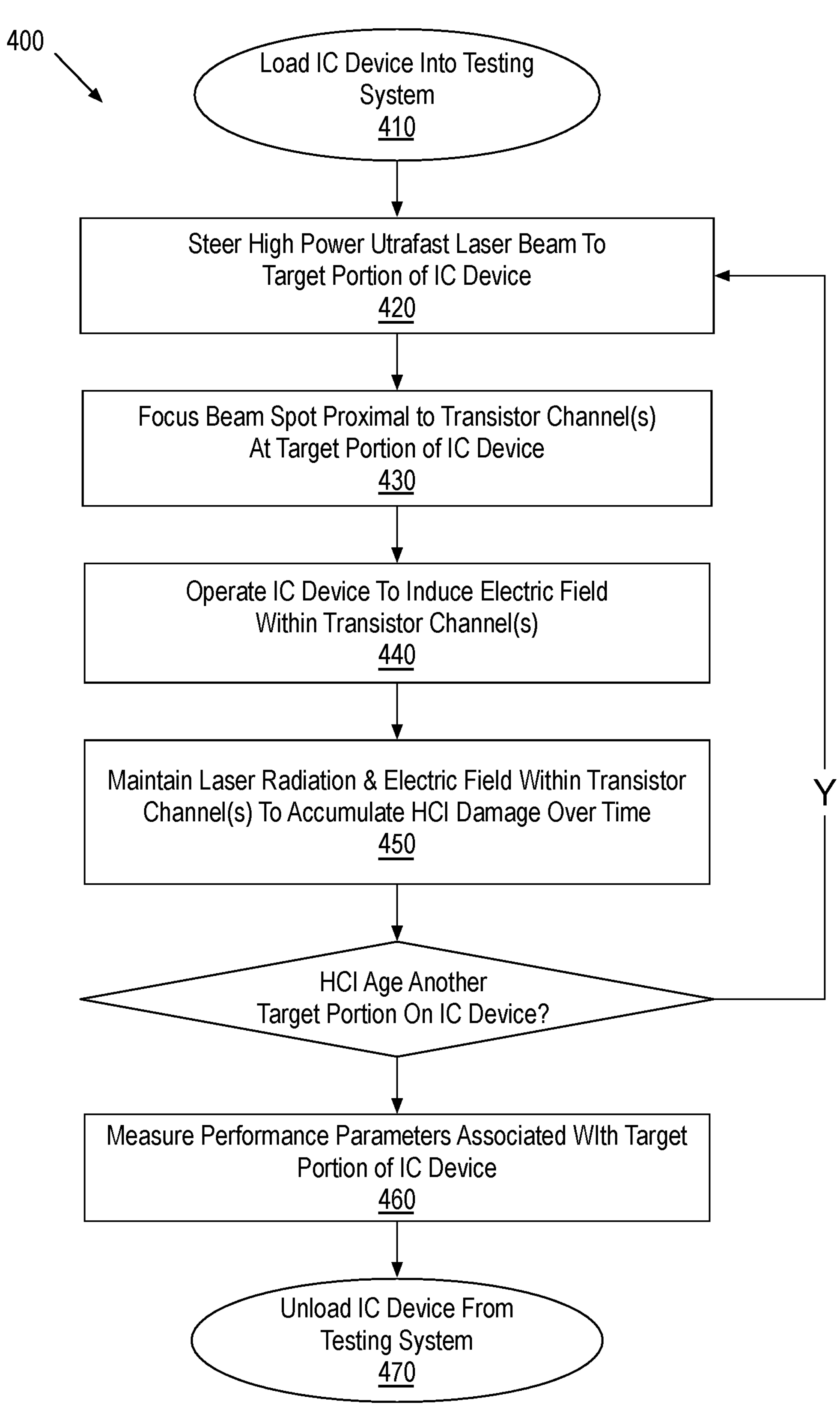
FIG. 4 is a flow diagram illustrating a laser-based method of accelerating damage through hot carrier injection at the circuit level within an IC device under test (DUT) that may otherwise be under normal operating conditions, in accordance with some embodiments.

FIG. 4 is a flow diagram illustrating laser-based methods 400 for accelerating damage through hot carrier injection at the circuit block level within an IC device under test (DUT) that may otherwise be under normal operating conditions. Methods 400 may be implemented by controller 190 in any of systems 100, 200 or 300, for example. To execute methods 400, controller 190 may be programmed with instructions stored on a computer readable media, such as a magnetic hard drive, a RAM, or the like.

Referring to FIG. 4, methods 400 begin at input 410 where an IC device is loaded into a testing system, such as any of systems 100, 200 or 300. At block 420, a high power, ultrafast laser beam is steered to a target portion of the IC device where one or more target transistor (e.g., FET) structures are located. Beam steering block 420 may comprise one or more of galvo control or control of a linear stage, such as laser stage 110 (FIG. 1) further described below. At block 430, the beam spot is focused within a field of view of the LSM and at a depth within IC DUT to intersect channel regions of one or more target transistor structures.

Figure 5:
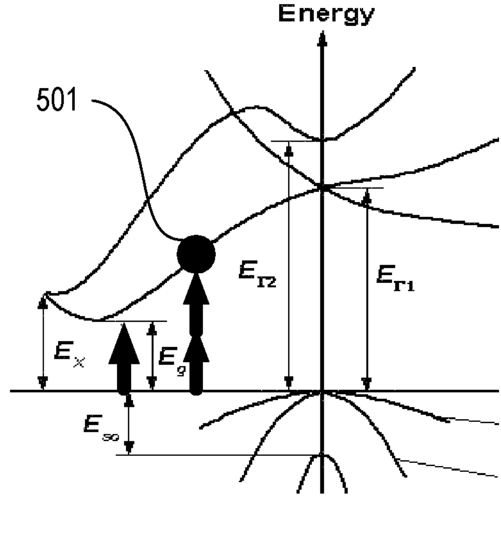
FIG. 5 is an energy band diagram illustrating multi-photon injection, in accordance with some embodiments.

Although the wavelength band of the laser beam is not readily absorbed by bulk substrate material of the channel regions of transistor structures, an extremely high photon density creates a finite probability of the simultaneous absorption of multiple photons. FIG. 5 is an energy band diagram illustrating multi-photon injection, in accordance with some embodiments where the laser source has sufficient peak power. In this example, although the energy of each of the two photons is less than bandgap energy $E_g$, a two-photon absorption process (TPA) promotes a charge carrier 501 to an energy level above the conduction band. Such energetic charge density thermalizes quickly. However, when this process occurs within the small physical confines of target transistor structures, the source-drain electric field accelerates the charge carriers into the drain creating accelerated hot carrier damage.

Returning to FIG. 4 with laser-based hot carriers generated, methods 400 continue at block 440. Block 440 is executed concurrently with the execution of blocks 420-430. At block 440, the IC DUT is operated by the electrical test interface to form an electric field with the channel regions of the target transistor structures. Advantageously, the electric field is induced with a source-drain bias voltage of less than 1.5V (e.g., 1.2V).

Figure 6:
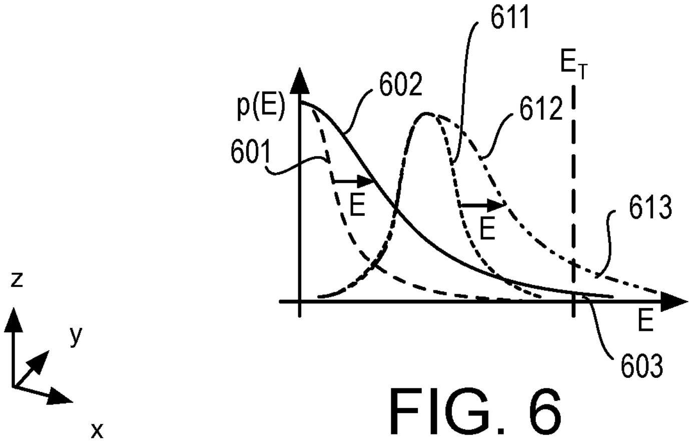
FIG. 6 is a graph comparing energy distributions of charge carriers under different conditions, in accordance with some embodiments.

FIG. 6 is a graph comparing energy distributions of charge carriers under different generation conditions, in accordance with some embodiments. As shown, a cold carrier population 601 within the channel region will only be accelerated by the internal electric field, E, into an energy density function 602, which is typical of transistor switching under normal operation as it includes only a small population of hot carriers 603 having an energy exceeding a threshold energy $E_T$. However, multi-photon-injected carriers of higher energy 611 are accelerated by the same internal electric field, E, into an energy density function 612 that has significantly more hot carriers 613 with an energy exceeding threshold energy $E_T$. This greater number of hot carriers 613 increases HC damage. Accordingly, the laser energy accelerates HCI aging of the targeted transistors.

As femtosecond laser pulses can be substantially adiabatic because the time over which they occur is less than the time required for heat to transmit and dissipate, carrier injection processes relying on these multi-photon absorption mechanisms should not induce/accelerate thermal damage. Also, since the photon wavelength is smaller than the bandgap of the semiconductor material (e.g., silicon) illuminated by the beam spot, light that has not generate carriers through a multi-photon absorption mechanism (e.g., TPA) should be reflected out of focus (e.g., by metallization within IC DUT, etc.) with minimal stray absorption processes.

Methods 400 (FIG. 4) continue at block 450 where a controller hold maintains the laser radiation within the target transistor(s), as well as the electric field, to accumulate sufficient HCI damage to become electrically measurable by any known techniques. In some exemplary embodiments, block 450 comprises a hold duration of at least multiple minutes. In some further embodiments, the hold duration is multiple hours and may extend to multiple days, or weeks. As noted above, laser beam steering over these significant hold times may be facilitated with a galvo comprising an optical encoder with a glass disk.

After the laser-based HCI aging of a target transistor, methods 400 may repeat blocks 420-450 for each additional target portion or region within a particular IC DUT. After all desired functional IC blocks have been aged with laser assist, methods 400 may continue to block 460 where one or more performance parameters suitable for assessing a particular functional IC block are measured electrically. Such electrical measurements may be performed by the electrical test interface of the HCI aging platform, for example. Although the performance parameters measured may vary according to the function of a particular IC block that has been HCI aged, in some examples at least an operational frequency of the IC block, a transistor I-V curve, a transistor threshold voltage ($V_t$), or a transistor $I_{on}/I_{off}$ ratio is measured at block 460. Methods 400 then complete at output 470 where the IC DUT is unloaded from the testing system.

Figure 7:
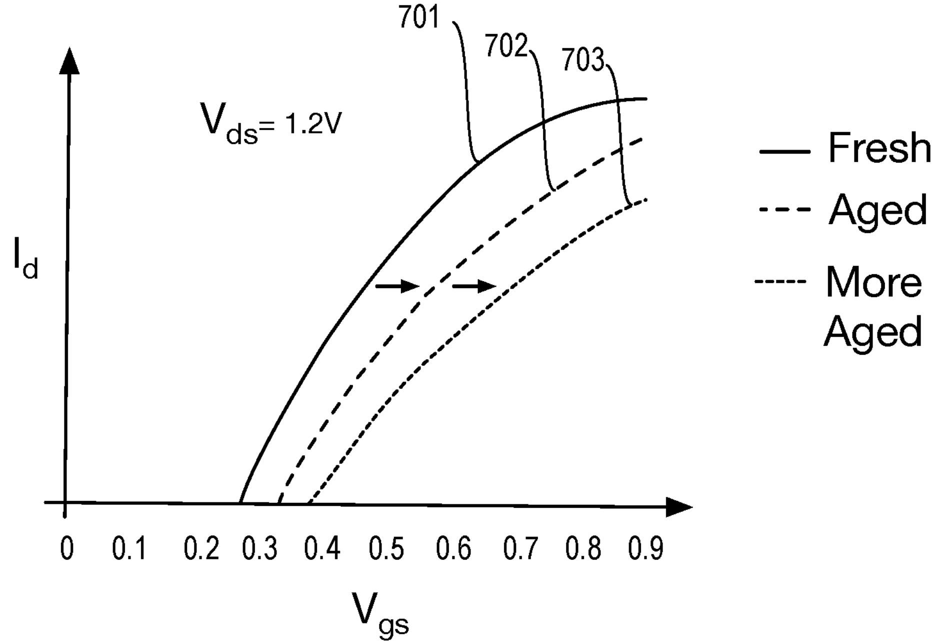
FIG. 7 is an I-V graph illustrating the laser-based HCI aging of a transistor, in accordance with some embodiments.

FIG. 7 is an I-V graph illustrating representative laser-based HCI aging of a transistor, in accordance with some embodiments. In FIG. 7, drain current $I_d$ as a function of gate-source bias voltage $V_{gs}$ is plotted for a transistor a three different ages. In fresh/new condition, the transistor displays I-V curve 701. After a first duration of laser-based HCI aging, for example performed with a source-drain bias voltage $V_{ds}$ of 1.2V and otherwise in accordance with embodiments herein, the transistor has degraded as evidenced by an I-V curve 702 that shifted to the left and has a lower slope. After an additional duration of laser-based HCI aging is performed (e.g., again with $V_{ds}$ of 1.2V), the transistor has further degraded as shown by I-V curve 703.

Notably, laser-based HCI aging performed with the same laser parameters, but at lower source-drain bias voltages has been found to display less degradation. This indicates a photoinjected charge cloud (611 in FIG. 6) alone is insufficient to cause transistor damage. Instead, such a charge cloud must also be within an electric field so the carriers can be accelerated by drift and cause the damage. This mechanism is substantially as found in normal use conditions. Hence, even though the laser beam spot size may be on the order of the center wavelength (e.g., 1550 nm), and is therefore much larger than the dimensions of contemporary transistors, only the portion of the spot within an electric field of a transistor induces the laser-assisted HCI aging described herein.

Figure 8:
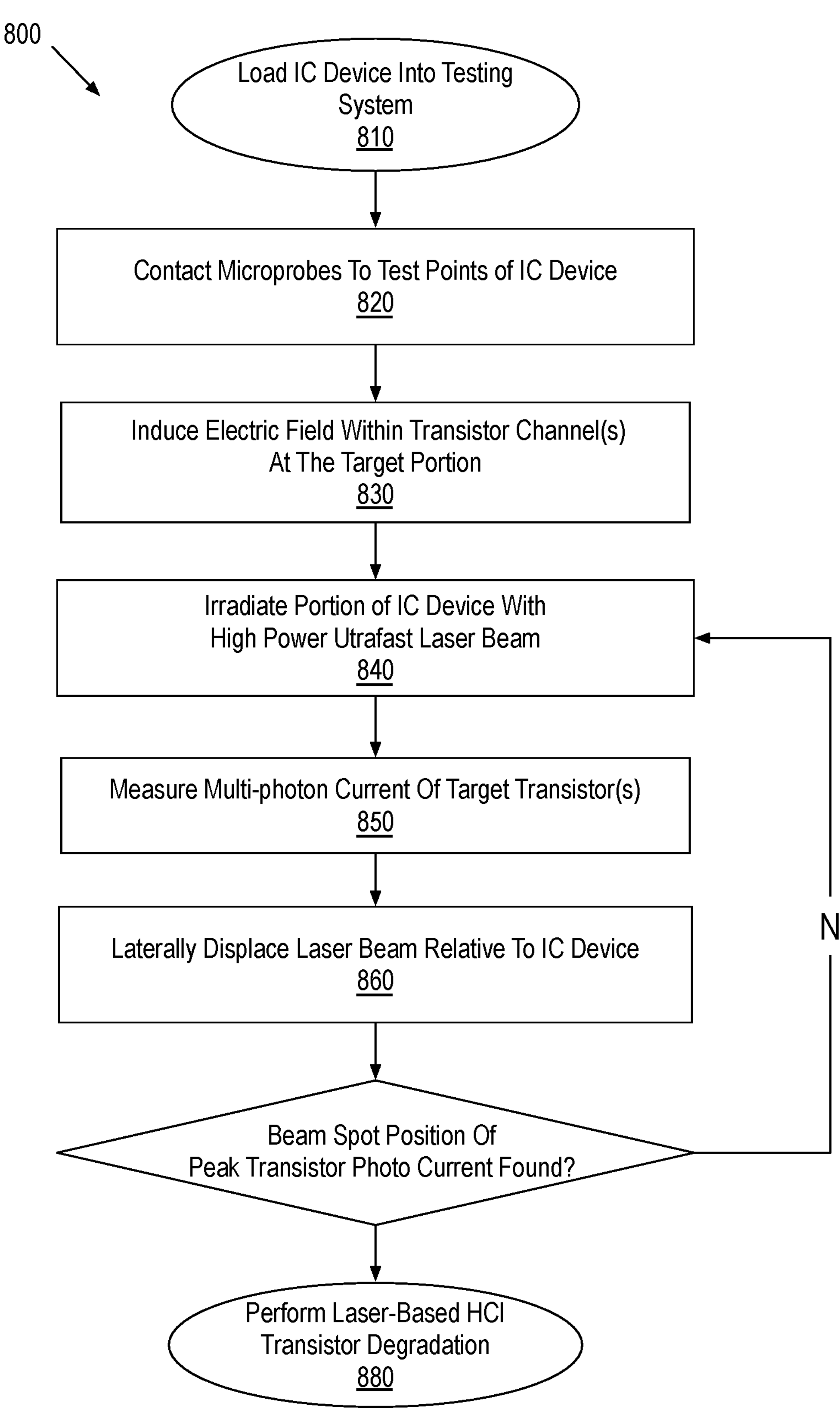
FIG. 8 is a flow diagram illustrating a method of positioning a laser for laser-based HCI aging of a transistor, in accordance with some embodiments.

Some systems suitable for performing laser-based accelerated HCI aging in accordance with embodiments herein comprise a linear stage that may be laterally displaced (e.g., within X-Y plane) with high precision. For example, in system 100 (FIG. 1) stage 110 may be coupled to nanopositioners, which may be controlled by controller 190 through one or more optically-encoded position-feedback sensors. For example, stage 110 may have an optical grating indexing 0.1 nm increments of lateral (x/y) displacement. Laser beam 125 may be coupled through such an x-y stage and positional alignment with one or more target transistors within IC DUT 101 may proceed according to methods 800, as illustrated in FIG. 8.

Methods 800 begin with loading an IC device into the testing system at input 810. Microprobes are contacted to electrical test points of the IC DUT at block 820. At block 830, an electrical interface (e.g., microprobe card 150 in FIG. 1) induces an electric field within channel regions of targeted transistors. At block 840 a portion of the IC DUT where the targeted device is thought to be is irradiated with the high-power ultrafast laser beam, generating charge carriers, for example substantially as described above. At block 850, the multi-photon injected current of target transistor(s) is measured while the laser beam is laterally displaced relative to the IC DUT at block 860, for example with the nanopositional x-y stage. As the multi-photon injected current measured in the target transistor(s) varies in response to the spatial overlap of the injected charge carriers and the channel region of the target transistor(s), the laser position associated with peak transistor current is found. Methods 800 may then complete at output 880 where laser-based HCI transistor degradation (aging) is performed while the laser is located relative to the IC DUT at the point of peak transistor current.

Figure 9:
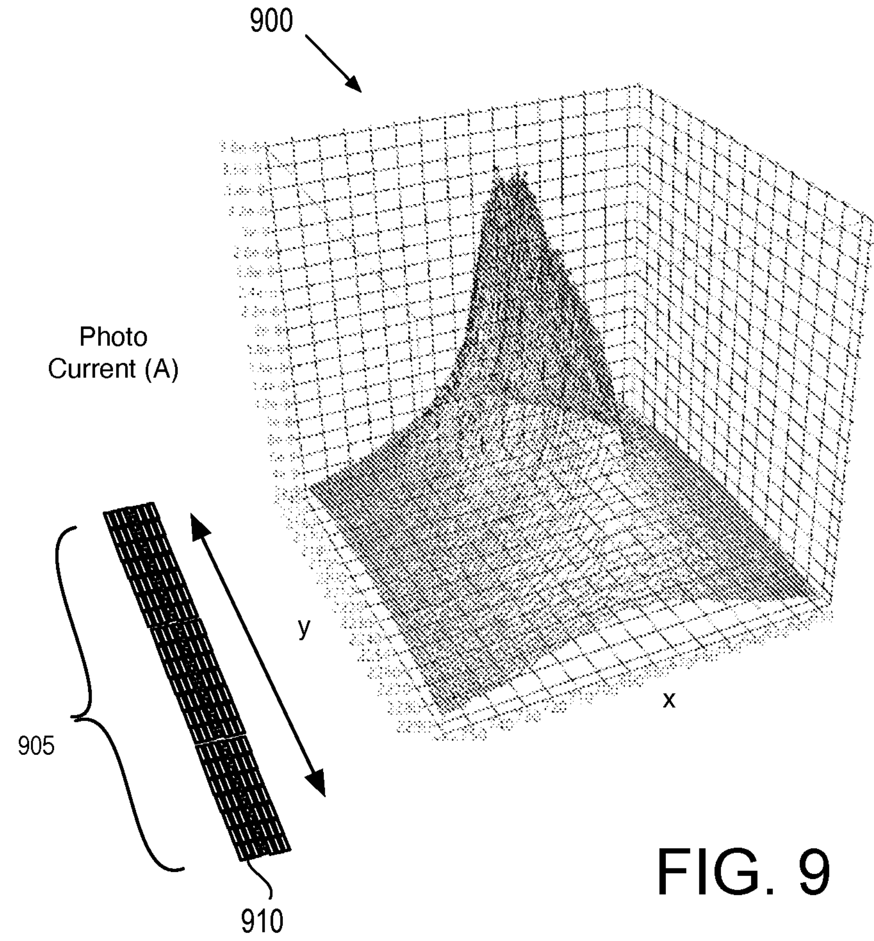
FIG. 9 is an isometric illustration of a measured current as a function of the relative position of a high-power ultrafast laser and a test structure from which the current is measured.

Methods 800 allow for accurate and repeatable navigation even though the target transistors are well below optical resolution. FIG. 9 is an isometric illustration of a measured current (e.g., $I_d$) mapped as a function 900 of the position of a high-power laser relative to a test structure 905 comprising an array of transistor structures 910 from which the laser-induced current is electrically measured through the tester interface. As shown, the shape of function 900 correlates to test structure 905 with current increasing as the laser beam irradiates channel regions of the transistor structures within the test structure. Accordingly, a controller may automatically position a laser relative to an IC DUT based on this multi-photon current response generated by the laser that is detectable upon optically positioning electrical microprobes upon features electrically coupled to test structure 905.

In further embodiments, the laser-assisted device degradation techniques described herein may be applied to a complex IC device, such as a microprocessor, as long as laser injection can be performed during operation of the IC device (e.g., from the bulk side in a flip chip package). Because of the spatial resolution afforded by the small laser spot size, the HCI aging described herein may target specific functional IC blocks within a complex IC device to characterize their individual reliability performance and guarantee the overall reliability of the product.

Figure 10:
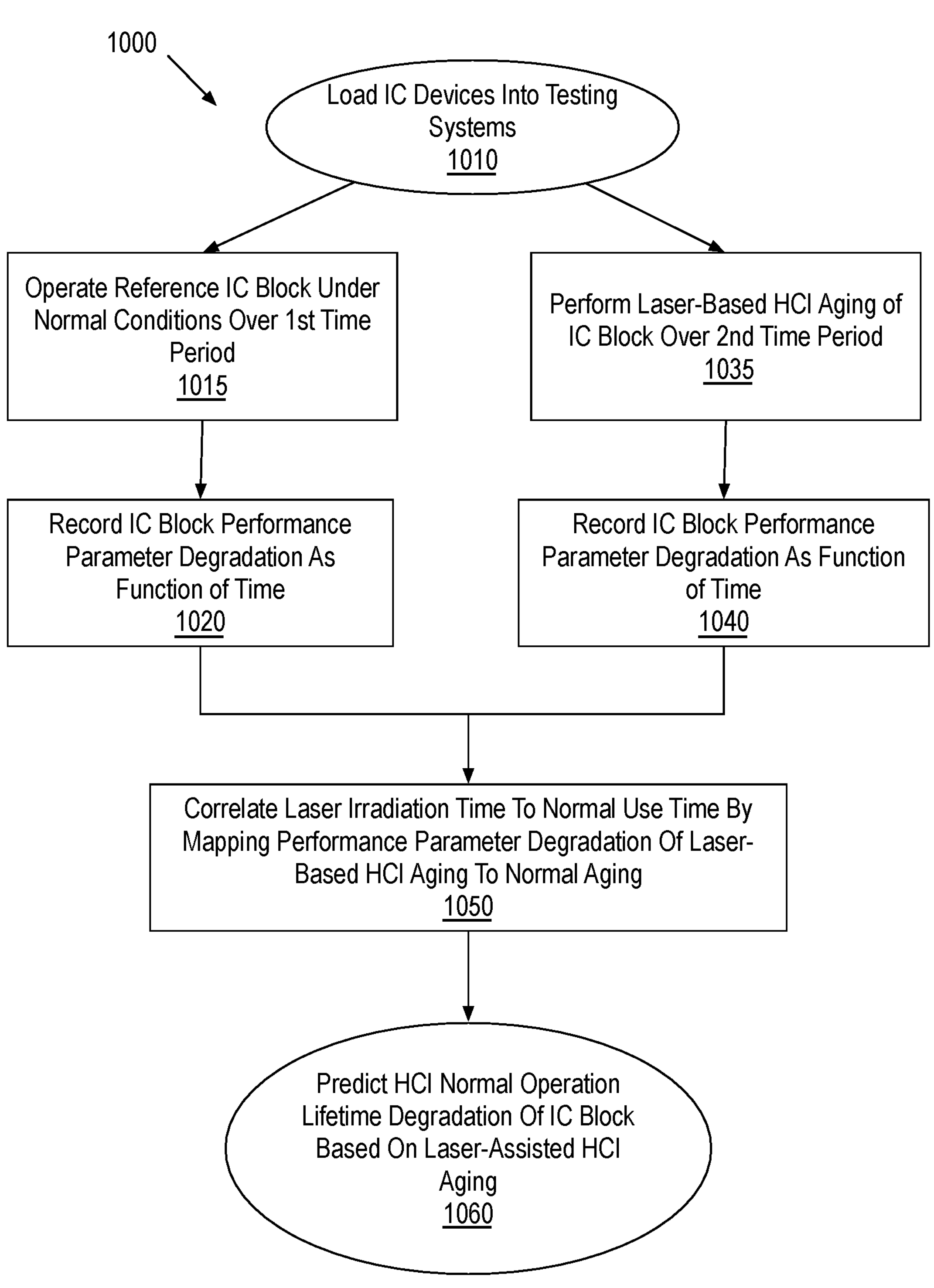
FIG. 10 is a flow diagram illustrating a method of predicting HCI lifetime degradation of an IC block with laser-based degradation.

Once progressive doses (i.e., durations) of laser-based aging demonstrate a consistent and/or predictable device degradation. Methods 1000 (FIG. 10) may be practiced to calibrate a laser dose to an equivalent use time under normal operating conditions for a particular functional IC block. Methods 1000 begin at input 1010 where two or more instances of an IC device are loaded into testing systems. At least one of the testing systems is to perform laser-based aging, for example in accordance with embodiments described above.

At block 1015, a functional IC block of the IC DUT is operated under normal conditions over some first time period. Exemplary functional IC blocks include, but are not limited to, a ring oscillator, a phase locked loop, or a memory array. The control treatment at block 1015 is to serve as a reference standard. Assuming the rate of HCI lifetime degradation under normal conditions is small, the first time period may be anywhere from a few months to a year. Over this first time period, functional IC block performance parameters (e.g., a data rate, operational frequency, etc.) are measured as a function of total operating time to determine a reference rate of degradation.

At block 1035, laser-based HCI aging of a second instance of the functional IC block is performed over a second time period. At block 1040, IC block performance parameters (e.g., a data rate, operational frequency, etc.) are similarly measured as a function of accelerated aging time to determine a rate of laser-assisted HCI aging. At block 1050, data collected at block 1040 is mapped to data collected at block 1020 to correlate laser irradiation time (dose) to normal use time. With this correlation, methods 1000 may complete at output 1060 where HCI lifetime degradation of the functional IC block operated under normal conditions is predicted based on a measured laser-assisted HCI degradation of the functional IC block. Since the laser-assisted HCI degradation may be collected in just a few days for any IC DUT, one may rapidly evaluate the reliability of various functional IC blocks.

Figure 11:
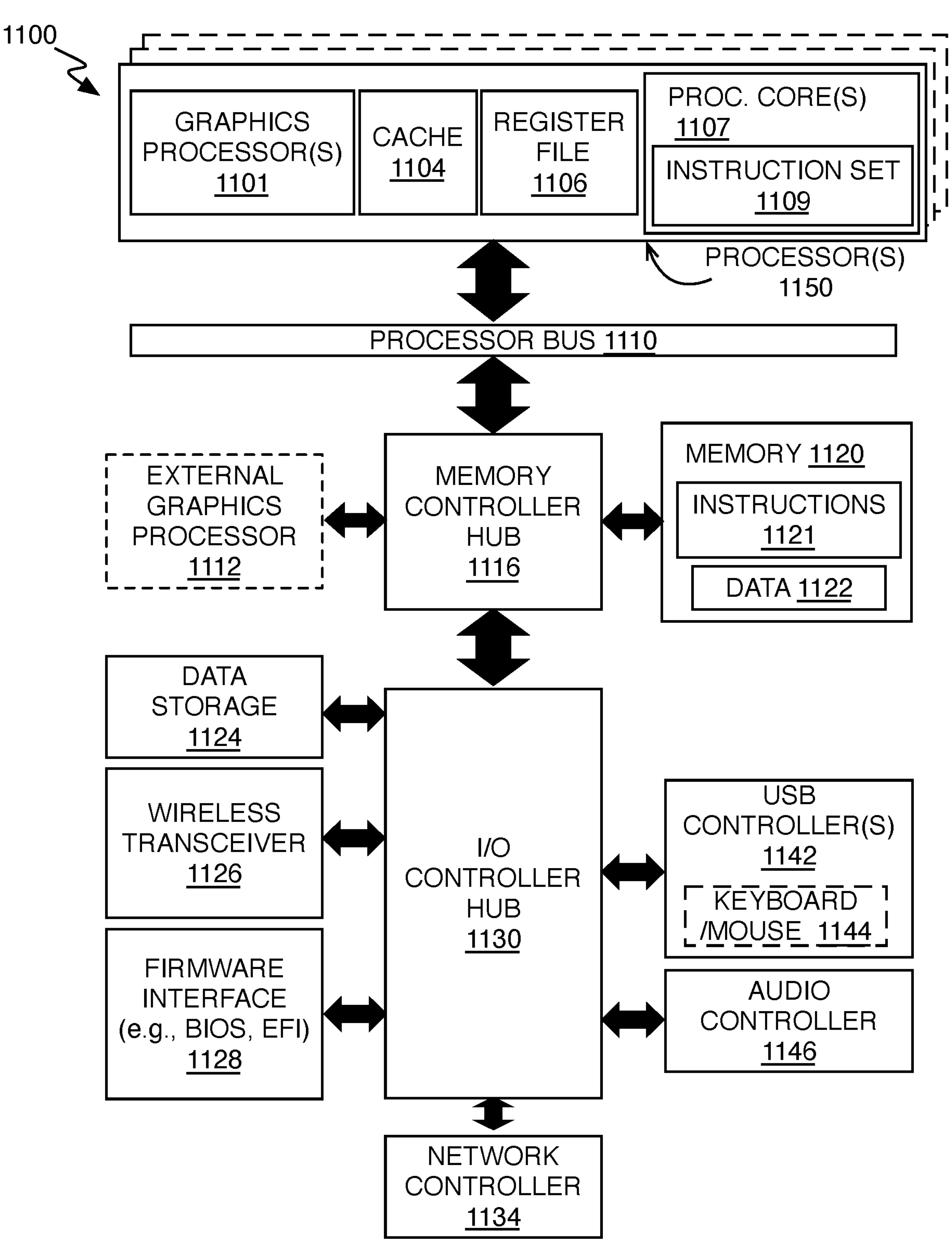
FIG. 11 is a block diagram of a data processing system for laser-assisted HCI lifetime degradation of an IC device under test, in accordance with some embodiments.

FIG. 11 is a block diagram of a data processing system 1100 that may be utilized to perform laser-assisted HCI lifetime degradation of an IC device under test. Data processing system 1100 includes one or more processors 1150 and one or more graphics processors 1101, and may be implemented in a single processor desktop system, a multiprocessor workstation system, or a server system having a large number of processors 1150 or processor cores 1107. In some embodiments, data processing system 1100 is a tablet computing device.

In some embodiments, the one or more processors 1150 each include one or more processor cores 1107 to process instructions which, when executed, perform operations for system and user software. In some embodiments, each of the one or more processor cores 1107 is configured to process a specific instruction set 1109. In some embodiments, instruction set 1109 may facilitate Complex Instruction Set Computing (CISC), Reduced Instruction Set Computing (RISC), or computing via a Very Long Instruction Word (VLIW).

Multiple processor cores 1107 may each process a different instruction set 1109, which may include instructions to facilitate the emulation of other instruction sets. Processor cores 1107 may also include other processing devices, such a Digital Signal Processor (DSP).

In some embodiments, processor 1150 includes cache memory 1104. Depending on the architecture, processor 1150 can have a single internal cache or multiple levels of internal cache. In some embodiments, the cache memory is shared among various components of processors 1150. In some embodiments, processors 1150 also use an external cache (e.g., a Level-3 (L3) cache or Last Level Cache (LLC)) (not shown), which may be shared among processor cores 1107, for example. A register file 1106 is additionally included in processors 1150 which may include different types of registers for storing different types of data (e.g., integer registers, floating point registers, status registers, and an instruction pointer register). Some registers may be general-purpose registers, while other registers may be specific to the design of the processor 1150.

In some embodiments, processors 1150 are coupled to a processor bus 1110 to transmit data signals between processors 1150 and other components in system 1100. System 1100 has a 'hub' system architecture, including a memory controller hub 1116 and an input output (I/O) controller hub 1130. Memory controller hub 1116 facilitates communication between a memory device and other components of system 1100, while I/O Controller Hub (ICH) 1130 provides connections to I/O devices via a local I/O bus.

Memory device 1120 can be a dynamic random access memory (DRAM) device, a static random access memory (SRAM) device, flash memory device, or some other memory device having suitable performance to serve as process memory. Memory 1120 can store data 1122 and instructions 1121 for use when processor 1102 executes a process. Memory controller hub 1116 also couples with an optional external graphics processor 1112, which may communicate with the one or more graphics processors 1101 and/or processors 1150 to perform various operations.

In some embodiments, ICH 1130 enables peripherals to connect to memory 1120 and processor 1102 via a high-speed I/O bus. The I/O peripherals include an audio controller 1146, a firmware interface 1128, a wireless transceiver 1126 (e.g., Wi-Fi, Bluetooth), and a data storage device 1124 (e.g., hard disk drive, flash memory, etc.). One or more Universal Serial Bus (USB) controllers 1142 may connect input devices, such as keyboard and mouse 1144 combinations. A network controller 1134 may also couple to ICH 1130. In some embodiments, a high-performance network controller (not shown) couples to processor bus 1110.

Figure 12:
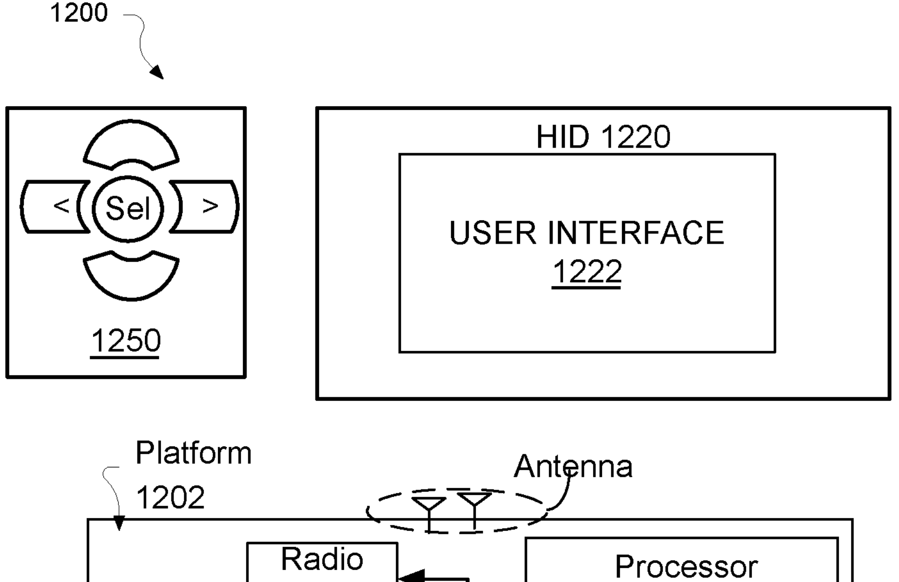
FIG. 12 is a diagram of an exemplary computer system including logic to perform HCI lifetime degradation, in accordance with some embodiments.
Figure 12:
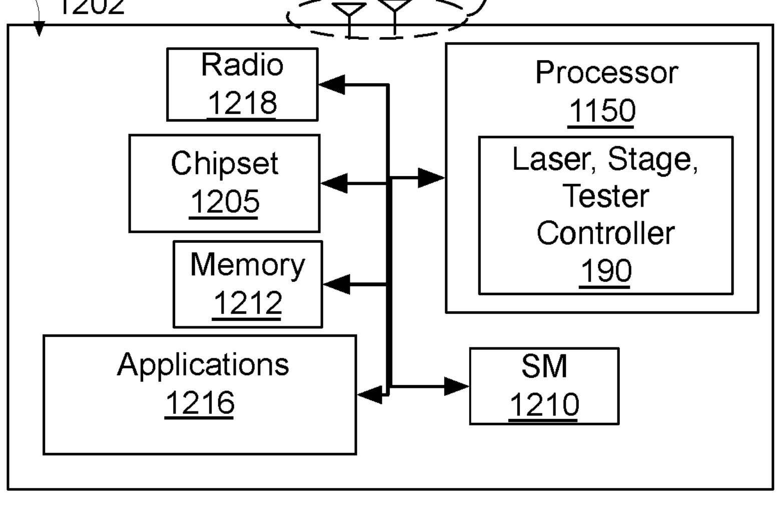
Figure 12:

FIG. 12 is a diagram of an exemplary system 1200, in accordance with one or more embodiments. System 1200 may be a desktop or laptop computer although system 1200 is not limited to this context. System 1200 may be incorporated into a tablet, touch pad, handheld computer, palmtop computer, cellular telephone, and so forth.

System 1200 includes a device platform 1202 that may implement all or a subset of the laser-assisted HCI aging methods described above in the context of FIG. 1-10. In various exemplary embodiments, processors 1150 executes laser control methods and test system control methods, for example as described elsewhere herein. In the illustrated embodiment, processor 1150 includes logic circuitry implementing controller 190, for example as described elsewhere herein. In some embodiments, one or more computer readable media may store instructions, which when executed by a processor 1150, cause the processor(s) to execute one or more of the laser, stage, scanning microscope, and/or electrical tester operations, for example as described elsewhere herein.

In embodiments, device platform 1202 is coupled to a human interface device (HID) 1220. Platform 1202 may collect tester data with scanning microscope module 1210, which is processed and output to HID 1220. A navigation controller 1250 including one or more navigation features may be used to interact with, for example, device platform 1202 and/or HID 1220. In embodiments, HID 1220 may include any user interface 1222, such as a monitor or display coupled to platform 1202 via radio 1218 and/or network 1260. HID 1220 may include, for example, a computer display screen, touch screen display, video monitor, television-like device, and/or a television.

In embodiments, device platform 1202 may include any combination of scanning microscope module 1210, chipset 1205, processors 1150, memory/storage 1212, applications 1216, and/or radio 1218. Chipset 1205 may provide intercommunication among processors 1150, memory 1212, applications 1216, or radio 1218.

Memory 1212 may be implemented as a volatile memory device such as, but not limited to, a Random Access Memory (RAM), Dynamic Random Access Memory (DRAM), or Static RAM (SRAM). Memory 1212 may also be implemented as a non-volatile storage device such as, but not limited to flash memory, battery backed-up SDRAM (synchronous DRAM), magnetic memory, phase change memory, and the like.

In embodiments, system 1200 may be implemented as a wireless system, a wired system, or a combination of both. When implemented as a wireless system, system 1200 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 1200 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

As exemplified above, embodiments described herein may be implemented using hardware elements, software elements, or a combination of both. Examples of hardware elements or modules include: processors, microprocessors, circuitry, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software elements or modules include: applications, computer programs, application programs, system programs, machine programs, operating system software, middleware, firmware, routines, subroutines, functions, methods, procedures, software interfaces, application programming interfaces (API), instruction sets, computing code, computer code, code segments, computer code segments, data words, values, symbols, or any combination thereof. Determining whether an embodiment is implemented using hardware elements and/or software elements may vary in accordance with any number of factors considered for the choice of design, such as, but not limited to: desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable storage medium. Such instructions may reside, completely or at least partially, within a main memory and/or within a processor during execution thereof by the machine, the main memory and the processor portions storing the instructions then also constituting a machine-readable storage media. Programmable logic circuitry may have registers, state machines, etc. configured by the processor implementing the computer readable media. Such logic circuitry, as programmed, may then be understood as physically transformed into a system falling within the scope of at least some embodiments described herein. Instructions representing various logic within the processor, which when read by a machine may also cause the machine to probe IC devices under test to perform the techniques described herein. Such representations may be stored on a tangible, machine-readable medium and supplied to various customers or manufacturing facilities to load into the electrical testing machines that analyze the circuitry of an IC device under test.

It will be recognized that the invention is not limited to the exemplary embodiments described in detail but can be practiced with modification and alteration without departing from the scope of the appended claims. For example, the above embodiments may include specific combinations of features as further provided below.

In first examples, an integrated circuit (IC) device testing apparatus, the apparatus comprising a stage comprising an area to support an IC device under test (DUT), an electrical test interface to induce an electric field within one or more transistors of the DUT, a laser source to output a beam of photons, and a controller to irradiate the transistors with the beam for a duration sufficient to induce their measurable degradation from charge carriers originated by the beam and accelerated by the electric field.

In second examples, for any of the first examples the laser source has an average output power rating of at least 1 W.

In third examples, for any of the first through second examples the laser beam is delivered with a pulse duration of less than 150 femtoseconds.

In fourth examples, for any of the third examples the pulse duration is no more than 100 femtoseconds.

In fifth examples for any of the second through fourth examples the DUT is to comprise a semiconductor material having a bandgap, and the laser source has an output energy less than the bandgap.

In sixth examples, for any of the fifth examples the laser source has an output wavelength of 1200 nm-1800 nm.

In seventh examples, for any of the sixth examples the output wavelength is 1550 nm.

In eighth examples, for any of the first through seventh examples the electric field is associated with a source-drain bias within the transistors induced by the electrical test interface.

In ninth examples, for any of the eighth examples the source-drain bias is less than 1.5V.

In tenth examples, for any of the ninth examples the source-drain bias is no more than 1.2V.

In eleventh examples, for any of the first through tenth examples the duration exceeds one minute.

In twelfth examples, for any of the first through eleventh examples a spot of the beam has a diameter of no more than 2 μm.

In thirteenth examples, for any of the first through twelfth examples the electrical test interface comprises a microprobe card comprising a microprobe array, a host applications board coupled to a power supply to power the IC device, or a probe card electrically coupled to automated test equipment (ATE).

In fourteenth examples for any of the first through thirteenth examples the stage comprises a material transparent to the laser beam and the beam is to pass through the stage. The stage is coupled to the controller through an optically-encoded position-feedback loop.

In fifteenth examples, a method of aging one or more transistors of an integrated circuit (IC) device comprises inducing an electric field within the transistors of the IC device, generating a beam of photons with a laser source, and generating charge carriers within the electric field by irradiating the transistors with the beam for a duration sufficient to induce a measurable degradation of the transistors.

In sixteenth examples, for any of the fifteenth examples the method comprises measuring an electrical performance parameter associated with the transistors during, or after, the aging.

In seventeenth examples, for any of the fifteenth through sixteenth examples the laser source has an average output power rating of at least 1 W within output wavelength of 1200 nm-1800 nm, and a pulse duration of less than 150 femtoseconds.

In eighteenth examples, for any of the fifteenth through sixteenth examples inducing the electric field comprises inducing a source-drain bias of no more than 1.2V.

In the nineteenth examples, for any of the fifteenth through eighteenth examples the duration exceeds one minute.

In twentieth examples, a method of testing an integrated circuit (IC) device comprises operating a first instance of a functional IC block under first conditions for a first time period, performing laser-based hot carrier aging of a second instance of the functional IC block for a second time period, shorter than the first time period, and correlating a laser irradiation time to a normal use time by mapping a performance parameter degradation of the second instance of the function IC block to that of the first instance of the functional IC block.

In twenty-first examples, for any of the twentieth examples the IC device comprises a processor including circuitry to execute an instruction set, and wherein the functional IC block comprise at least one of a ring-oscillator, a phase locked loop, or a memory array.

In twenty-second examples, for any of the twenty-first examples the performance parameter comprises an operational frequency of the IC block.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) device testing apparatus, comprising:

a stage comprising an area to support an IC device under test (DUT);

an electrical test interface to induce an electric field within one or more transistors of the DUT;

a laser source to output a beam of photons; and a controller to irradiate the one or more transistors with the beam for a duration sufficient to induce their measurable degradation from charge carriers originated by the beam and accelerated by the electric field.

2. The IC device testing apparatus of claim 1, wherein the laser source has an average output power rating of at least 1 W.

3. The IC device testing apparatus of claim 2, wherein the beam of photons is delivered with a pulse duration of less than 150 femtoseconds.

4. The IC device testing apparatus of claim 3, wherein the pulse duration is no more than 100 femtoseconds.

5. The IC device testing apparatus of claim 2, wherein:

the IC DUT is to comprise a semiconductor material having a bandgap; and the laser source has an output energy less than the bandgap.

6. The IC device testing apparatus of claim 5, wherein the laser source has an output wavelength of 1200 nm-1800 nm.

7. The IC device testing apparatus of claim 6, wherein the output wavelength is 1550 nm.

8. The IC device testing apparatus of claim 1, wherein the electric field is associated with a source-drain bias within the one or more transistors induced by the electrical test interface.

9. The IC device testing apparatus of claim 8, wherein the source-drain bias is less than 1.5V.

10. The IC device testing apparatus of claim 1, wherein the duration exceeds one minute.

11. The IC device testing apparatus of claim 1, wherein a spot of the beam has a diameter of no more than 2 μm, and wherein the beam is to pass through a substrate on a backside of the IC DUT before it irradiates the one or more transistors.

12. The IC device testing apparatus of claim 1, wherein the electrical test interface comprises:

a microprobe card comprising a microprobe array;

a host applications board coupled to a power supply to power the IC device, or a probe card electrically coupled to automated test equipment (ATE).

13. The IC device testing apparatus of claim 1, wherein:

the stage comprises a material transparent to the beam of photons and the beam of photons is to pass through the stage; and the stage is coupled to the controller through an optically-encoded position-feedback loop.

14. A method of aging one or more transistors of an integrated circuit (IC) device, the method comprising:

inducing an electric field within the transistors of the IC device;

generating a beam of photons with a laser source;

generating charge carriers within the electric field by irradiating the transistors with the beam of photons for a duration sufficient to induce a measurable degradation of the transistors.

15. The method of claim 14, further comprising measuring an electrical performance parameter associated with the one or more transistors during, or after, the aging.

16. The method of claim 14, wherein the laser source has an average output power rating of at least 1 W within an output wavelength of 1200 nm-1800 nm, and a pulse duration of less than 150 femtoseconds.

17. The method of claim 14, wherein inducing the electric field comprises inducing a source-drain bias of no more than 1.2V.

18. The method of claim 14, wherein the duration exceeds one minute.

19. A method of testing an integrated circuit (IC) device, the method comprising:

operating a first instance of a functional IC block under first conditions for a first time period;

performing laser-based hot carrier aging of a second instance of the functional IC block for a second time period, shorter than the first time period;

correlating a laser irradiation time to a normal use time by mapping a performance parameter degradation of the second instance of the functional IC block to that of the first instance of the functional IC block.

20. The method of claim 19, wherein:

the IC device comprises a processor including circuitry to execute an instruction set, and wherein the functional IC block comprise at least one of a ring oscillator, a phase locked loop, or a memory array; and the performance parameter comprises an operational frequency of the functional IC block.

* * * * *